United States Patent [19]

DaSilva

[11] Patent Number: 4,939,481
[45] Date of Patent: Jul. 3, 1990

[54] LOW PHASE NOISE VOLTAGE CONTROLLED OSCILLATOR

[75] Inventor: Marcus DaSilva, Spokane, Wash.

[73] Assignee: Hewlett-Packard Company, Palo Alto, Calif.

[21] Appl. No.: 212,849

[22] Filed: Jun. 29, 1988

[51] Int. Cl.$^5$ .................. H03B 5/12; H03B 5/18
[52] U.S. Cl. .................. 331/117 R; 331/117 D; 331/117 V
[58] Field of Search .................. 331/36 C, 96, 117 D, 331/117 R, 117 FE, 177 V, 167

[56] References Cited

U.S. PATENT DOCUMENTS 3,571,754  3/1971  Healey, III et al. ....... 331/177 V X
4,536,724  8/1985  Hasegawa et al. ............. 331/177 V
4,621,205  11/1986  Miller ................................. 307/320

Primary Examiner—Siegfried H. Grimm

[57] ABSTRACT

A varactor diode tuned voltage controlled oscillator which simultaneously optimizes several techniques to minimize AM to FM conversion in the LC resonant circuit to provide an RF signal having minimum phase noise is described. A high gain current limiting RF amplifier is coupled to a high Q, high capacitance, low impedance LC resonant circuit by an impedance transformation network to provide a high tank circulating power having minimum RF voltage fluctuations. The RF voltage across the varactor tuning diodes is further reduced by connecting two varactor diodes in series, back-to-back, or by connecting a fixed capacitance in series with the parallel connected varactor diodes.

9 Claims, 4 Drawing Sheets

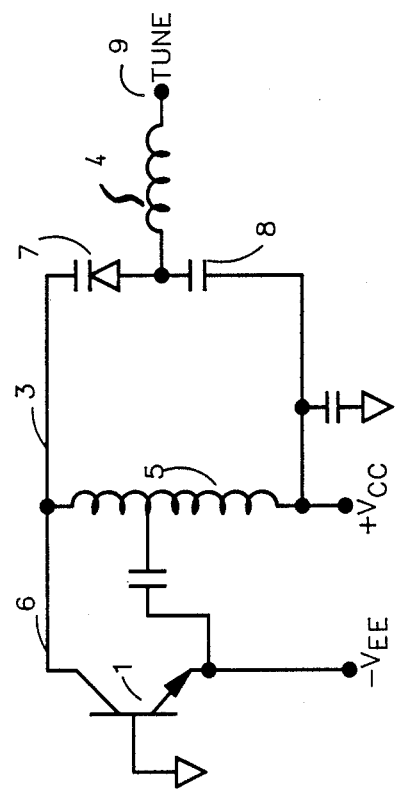
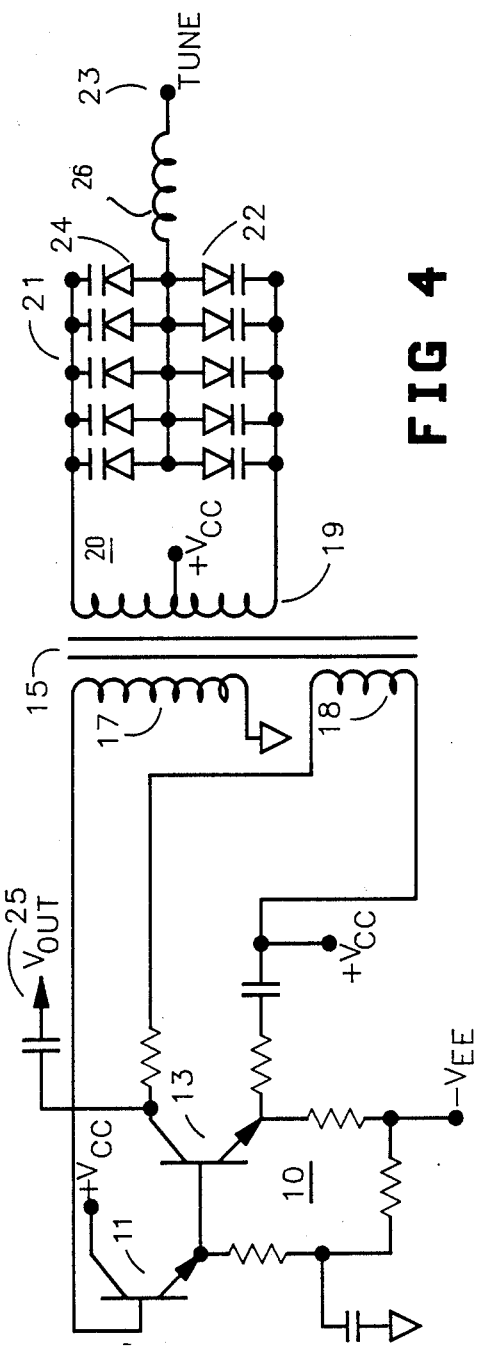
PRIOR ART
FIG 1
FIG 4

LOW PHASE NOISE VOLTAGE CONTROLLED OSCILLATOR

BACKGROUND OF THE INVENTION

The present invention relates generally to a low noise voltage controlled oscillator (VCO), and more particularly to VCOs employing an LC resonant circuit having high capacitance and low inductance in combination with amplifiers and impedance transformation networks to provide a low phase noise RF signal.

Electrically controlled or voltage controlled oscillators are used in many applications, one example being indirect frequency synthesis utilizing phase-locked loops. An effective way to achieve electrical tuning in VCOs is to use varactor diodes to provide a variable capacitive element in a LC resonant circuit. The varactor diode has a variable capacitance that is dependent upon the reverse bias applied across the diode. Varying the reverse bias voltage applied across the diode varies the capacitance hence tuning the oscillator. While varactor diodes can tune over a wide frequency band while exhibiting low loss characteristics comparable to mechanical variable capacitors, varactor diodes are non-linear capacitors and exhibit noise mechanisms nonexistent in conventional capacitors. Varactor diode tuned oscillators typically exhibit higher phase noise than those employing mechanical tuning. This effect is especially pronounced when the VCO is tuned over a wide frequency band, such as over 10 percent in terms of band ratio. One prior art solution to this problem has been to use several narrow bands to cover a desired frequency band by switching in additional fixed capacitance to change from one band to the next or by providing two or more narrow band VCOs.

Effects inherent in varactor diodes are the dominant factors contributing to a high phase noise level in the wide band VCOs. Since the varactor diode is a non-linear device, a large high frequency (RF) voltage results in a non-linear capacitance variation that is a function of the RF voltage. This non-linear capacitance variation produces a higher phase noise level in wide band VCOs. U.S. Pat. No. 4,536,724 entitled "Voltage Controlled Oscillator Having Three or More Varactor Diodes", issued on Aug. 20, 1985 to Makoto Hasegawa et al discloses a VCO having an LC resonant circuit including a varactor circuit comprising three or more varactor diodes connected in series so that the RF voltage applied to the varactor circuit is divided across the series connected varactor diodes thereby minimizing the RF voltage applied across a single varactor diode. U.S. Pat. No. 4,621,205 entitled "Method and Apparatus for Reducing Varactor Noise" issued on Nov. 4, 1986 to Brian M. Miller discloses connecting blocks of parallel connected varactor diodes in series to reduce varactor diode noise.

SUMMARY OF THE INVENTION

A VCO constructed in accordance with the principles of the present invention comprises a low impedance, high capacitance, LC resonant circuit with a low RF voltage swing and high RF power to provide a high signal-to-noise ratio. The LC resonant circuit or resonator has a plurality of varactor diodes connected in parallel to provide a high capacitance which is connected with an inductance to form a parallel resonant circuit. The LC resonant circuit is connected to the output circuit of a high gain, high impedance current limiting RF amplifier whose output impedance is greatly mismatched with the LC resonant circuit input impedance thereby keeping the loading on the LC resonant circuit to a minimum thus allowing the current limiting amplifier to operate with a high signal current while keeping the resonator RF voltage swing low. In a preferred embodiment, the LC resonant circuit inductance and the coupling for the amplifier feedback is fabricated from a length of semi-rigid coaxial cable resulting in a simple and inexpensive implementation.

BRIEF DESCRIPTION OF THE DRAWINGS

FIG. 1 is a schematic diagram of a typical prior art varactor tuned oscillator;

FIG. 4 is a schematic diagram of a varactor tuned voltage controlled oscillator constructed according to the principles of the present invention;

DETAILED DESCRIPTION OF THE PREFERRED EMBODIMENT

Figure 3:
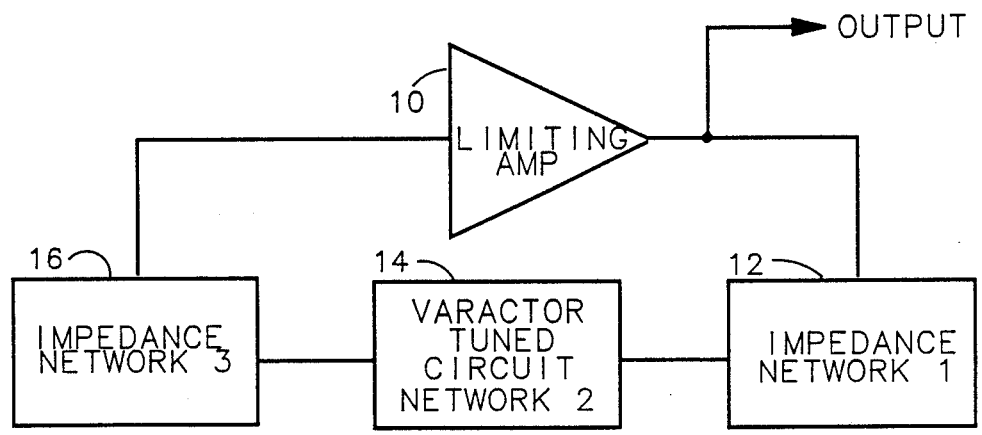
FIG. 3 is a block diagram of a varactor diode tuned voltage controlled oscillator constructed in accordance with the present invention.

FIG. 1 is a schematic diagram illustrating a conventional voltage controlled oscillator (VCO) utilizing a varactor diode 7 as the tuning element. The conventional VCO of FIG. 1 comprises an oscillating circuit connected as a common base amplifier 1 and a resonant or tuning circuit 3. The resonant circuit 3 comprises a resonant coil 5, a fixed capacitance 8, varactor diode 7 and tuning line 9. The varactor diode 7 is arranged to receive a DC bias or tuning control voltage through the choke coil 4 in tune line 9 which functions as a DC bias supply circuit such that the capacitance of the varactor diode 7 changes in accordance with DC voltage applied thereto. Typically such a VCO will utilize a hyperabrupt varactor as the tuning element 7. Its capacitance will normally vary over a 5:1 range, for example, 30 picofarads (pF) at 3 volts bias and 6 pF at 25 volts bias.

All amplifier or oscillator circuits will have several sources of noise. The most important sources are thermal noise and shot noise. Thermal noise is caused by the random motion of electrical charges in any conductive material. Thermal noise manifests itself as noise power proportional to temperature and is produced by all resistive elements in a circuit. Shot noise, sometimes referred to as corpuscular noise, is caused by the discrete nature of electric currents. It manifests itself as a shot noise current associated with semiconductor junctions. Both shot noise and thermal noise have power spectral distributions that are flat. At frequencies which are close to the tuned or carrier frequency of the oscillator, i.e., within the bandwidth of the oscillator, there are also additive noise mechanisms whose power spectral distribution is inversely proportional to frequency. This additive noise is sometimes referred to as 1/f noise.

The frequency spectrum of the oscillator output signal can be expressed as a carrier signal having noise side bands. The noise side bands can be broken down into amplitude modulation (AM) and phase modulation (PM) components. Thus the output signal can be characterized as a carrier signal that has been amplitude modulated as well as phase modulated by noise. The PM component is known as phase noise. Phase noise is best expressed utilizing a single side band (SSB) phase noise plot.

Figure 2:
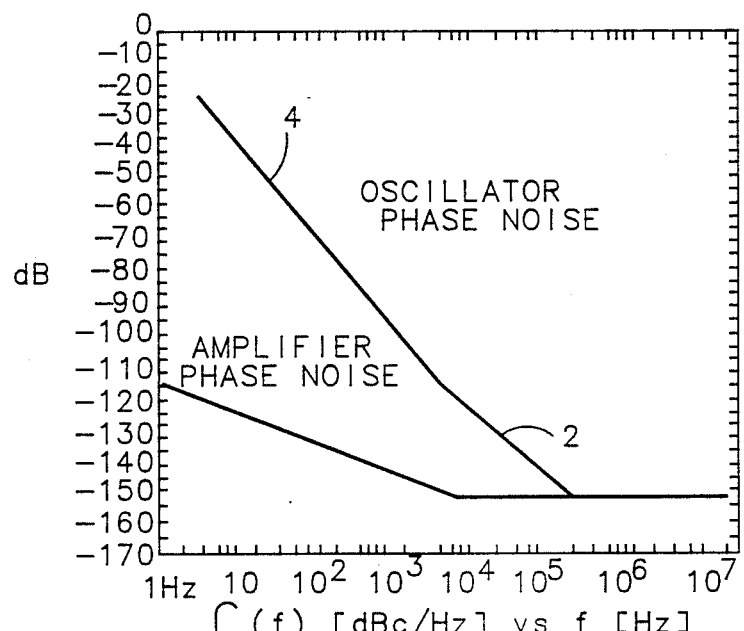
FIG. 2 is a single sideband phase noise plot of a typical voltage controlled oscillator.

Referring now also to FIG. 2, the SSB phase noise plot of an oscillator has a characteristic shape. For frequency offsets from the carrier frequency greater than the 3 dB bandwidth of the resonator or tank circuit, the plot of the SSB phase noise has a flat frequency distribution. Within the resonator bandwidth, the amplifier phase perturbations are transformed into frequency perturbations by the resonator phase-frequency response. In this region, the flat amplifier noise distribution is transformed into oscillator phase noise with a slope 2 of −20 dB/decade. At low frequency offsets from the carrier, the 1/f amplifier noise is converted to noise side bands contributing to the oscillator phase noise. The resonator phase-frequency response converts 1/f noise oscillator phase noise side bands having a −30 dB/decade slope 4 within the 3 dB bandwidth of the resonator.

The resonator plays a major role in the noise characteristics of a VCO. The two quantities that most effect phase noise performance in VCOs are the signal-to-noise ratio (SNR) and resonator bandwidth, often expressed as a quality factor or Q. Low noise VCO design involves maximizing the SNR and the resonator Q. The effects of both the input and output impedances of the amplifier are also included in analyzing the SNR and the resonator Q.

Typically when designing low noise oscillators it is desirable to maximize the resonator circulating power, this, in turn, maximizes the SNR by keeping the noise power low when compared to the carrier power. The SNR is determined by the ratio at the amplifier input of the signal level to the noise level caused by all noise sources when referred to the amplifier input. The amount of circulating power in the resonator is set by the amplifier current limiting mechanism, typically collector current limiting. Since the signal in the resonator is coupled back to the amplifier input, high resonator power means a high signal level at the amplifier input. Within limits, the SNR can be arbitrarily increased by causing the amplifier to limit at a higher current level. This will improve the phase noise provided that varactor diodes are not used in the resonator circuit.

Varactor diodes are non-linear capacitors and, when used for tuning a VCO, typically convert amplitude fluctuations into frequency fluctuations. This AM to FM conversion is a major source of phase noise in varactor diode tuned VCOs. Low noise varactor diode tuned VCOs require tradeoffs between resonator Q, SNR, AM noise and AM to FM conversion. The optimum phase noise achieved with this compromise is at a level where the AM to FM contribution to phase noise is substantially equal to the contribution caused by SNR and the circuit Q. Conventionally, in an oscillator such as shown in FIG. 1, SNR is sacrificed to reduce AM to FM conversion.

The capacitance of a varactor diode is a nonlinear function of the total voltage applied to the diode. This dependence of the diode capacitance on applied voltage converts RF voltage variations to capacitance variations thus causing the resonant frequency of the resonator to change with the amplitude of the RF voltage. Other non-linear elements in the oscillator circuit can also convert AM to FM or AM to PM. The AM to FM conversion due to the varactor diodes is the dominant mechanism that generates phase noise in wide tuning VCOs. AM to FM conversion by varactor diodes increases with RF amplitude level and is worst at low diode reverse bias conditions. The AM to FM conversion coefficient for a varactor diode tuned resonator can be approximated by:

$$\frac{dF}{dA} \approx \frac{f_o a(a/2 - 1)A}{4V_b^2}$$

where
$A$ = RF peak amplitude
$V_b$ = varactor diode bias
$a$ = the constant in the varactor diode power law As shown by the above equation, any fluctuation in the amplitude A of the RF signal in a resonator circuit converts to a change in the resonant frequency. Any noise signal that amplitude modulates the resonator voltage is a contributor to the carrier phase noise. Under current limiting conditions, the magnitude of the amplifier collector bias current sets the level of the RF power circulating in the resonator circuit. That portion of the amplifier total noise that is AM noise and any fluctuations in the collector bias current are the major contributors of AM noise in a conventional oscillator circuit.

There are several methods that can be utilized to reduce the noise resulting from AM to FM conversion. A varactor diode that is characterized by a diode power law which minimizes the AM to FM conversion may be used. However, the range for the varactor diode power law is limited and other concerns often dictate the choice of which circuit elements to use. Fixed capacitors can be used either in series or in parallel with the varactor diodes. This will reduce the AM to FM conversion but also reduces the total tuning range of the resonator circuit. The magnitude of the RF voltage on the varactor diode may be reduced or the magnitude of AM in the varactor signal may be reduced. Typically the latter two methods are easily pursued.

The magnitude of the RF voltage on the varactor diodes can be reduced by several methods:

1. The circulating RF power of the resonator circuit may be reduced. This reduces the SNR and trades AM to FM conversion for SNR. The best results are achieved when the contributions from both sources are substantially equal. Most conventional low noise varactor tuned VCOs operate near this optimum level.

2. Utilizing two or more varactor diodes connected in series back-to-back reduces the magnitude of the RF voltage on each varactor; however, it also reduces the total circuit capacitance. To achieve the same total capacitance requires four varactor diodes to replace one varactor diode. Utilizing two or more varactor diodes connected in series reduces AM to FM conversion without increasing the noise contribution from the SNR.

3. Reducing the resonator or tank impedance reduces the RF signal voltage required for the same circulating RF power in the resonator circuit. If impedance transformation means is utilized between the amplifier and the resonator, the transformation ratio must also be adjusted to maintain the SNR. Low impedance, high Q resonator circuits require a large capacitance value. This requires the use of varactor diodes having a large value capacitance or the equivalent paralleling of several varactor diodes. No penalty is paid for paralleling several varactor diodes other than an increase in the number of components.

Low frequency fluctuations in the amplifier collector bias current caused by collector current shot noise is the major contribution to AM noise. Amplifiers that utilize current limiting produce a maximum signal current that is proportional to the collector bias current. Since shot noise current increases as the square root of the collector bias current, increasing the collector bias current will increase the ratio of signal current to shot noise current thus reducing the amount of AM noise modulation on the RF carrier signal. A fourfold increase in collector bias current results in a twofold improvement in the ratio of carrier AM noise. An increase in signal current from the amplifier causes an increase in the RF voltage on the resonator circuit and a greater amount of AM to FM conversion unless the impedance presented to the amplifier by the resonator circuit is also reduced thus maintaining a low RF voltage. This may be achieved by utilizing a transformer or other transformation network to reduce the impedance presented to the amplifier output, typically 15 ohms or less. This represents an unusually high impedance mismatch between the amplifier output and the LC resonant circuit when compared to prior art implementations. The signal loss due to this impedance mismatch must be overcome by a sufficiently high amplifier gain in order to sustain oscillations.

Referring now to FIG. 3, a block diagram of a low noise VCO comprising an amplifier 10, a first impedance transformation network 12 coupling the output of the amplifier to a varactor tuned LC resonant circuit 14 and a second impedance transformation network 16 coupling a feedback signal from the resonant circuit 14 to the input of the amplifier 10 is shown. Amplifier 10 is a high gain, low noise current limited amplifier providing a high output current and having a high collector bias current. The LC resonant circuit 14 is a high capacitance, high Q tank circuit designed with minimum impedance to provide a high circulating power and, at the same time, a low RF voltage. To further reduce the RF voltage across the varactor tuning diodes, several varactor diodes may be connected in series, or one varactor diode, or a number of parallel varactor diodes, may be connected in series with a fixed capacitance. The impedance transformation network 12 couples the output of the high impedance amplifier 10 to the low impedance resonant circuit 14. A large impedance mismatch is required to allow the amplifier 10 to operate with a high collector bias current, and high signal current, while keeping the resonator circuit 14 RF voltage low. Impedance transformation network 12 is designed to present to the RF amplifier 10 output an LC resonant circuit 14 impedance on the order of 10 to 15 ohms. Similarly, impedance transformation network 16 couples a feedback signal from the low impedance resonator circuit 14 to the high impedance amplifier 10 input. Impedance transformation network 16 is designed to present an input impedance to the RF amplifier 10 which allows the optimum tradeoff between SNR of the RF signal and the loading of the LC resonant circuit 14 while achieving a minimum threshold minimum. The large impedance mismatch between the amplifier 10 and the resonator circuit 14 requires that the amplifier 10 have high gain to overcome the high signal loss and to sustain oscillations.

Referring now to FIG. 4, a schematic diagram of a preferred embodiment of the low noise voltage controlled oscillator according to the present invention is shown. The VCO comprises generally an amplifier circuit 10 and a LC resonant circuit 20. The amplifier circuit 10 is of a conventional design comprising transistors 11 and 13 connected as a Darlington pair to provide high gain while keeping the input impedance high to provide minimum loading on the LC resonant circuit 20. Amplifier 10 is transformer coupled via the coupling transformer 15 to the LC resonant circuit 20.

The LC resonant circuit 20 comprises a varactor diode circuit 21 which includes a parallel circuit of a plurality of series circuits of varactor diodes 22 and 24. Each series circuit leg or branch includes a pair of varactor diodes 22, 24 which are connected in series, anode to anode. The varactor parallel circuit 21 is connected in series with resonant coil 19. Resonant coil 19 comprises a center tapped secondary of coupling transformer 15, with the center tap connected to a DC voltage supply. The tune line 23 is connected to the anode of each varactor 22, 24 to provide a DC bias voltage and tuning signal via choke coil 26.

The two varactor diodes 22, 24 connected in each series circuit results in lower RF voltage being applied to each varactor resulting in reduced AM to FM conversion. The parallel arrangement of a number of series circuits increases the total capacitance of the varactor circuit 21 thereby providing a wide frequency range and a low circuit impedance. At resonance the LC circuit impedance presented to the amplifier circuit 10 output is preferably less than 15 ohms. The low impedance at resonance reduces the RF voltage swing while allowing a high value of resonant circuit power required for a good SNR.

Coupling transformer 15 greatly reduces the impedance that the LC resonant circuit 20 presents to the amplifier 10 thus allowing amplifier operation with high bias current while keeping the RF voltage swing coupled to the LC resonant circuit 20 to a minimum value. Primary winding 17 provides feedback from the collector circuit of transistor 13 to the input of the Darlington amplifier 10 at the base of transistor 11. The output of the VCO is capacitor coupled from the collector circuit of transistor 13 on line 25.

Figure 5:
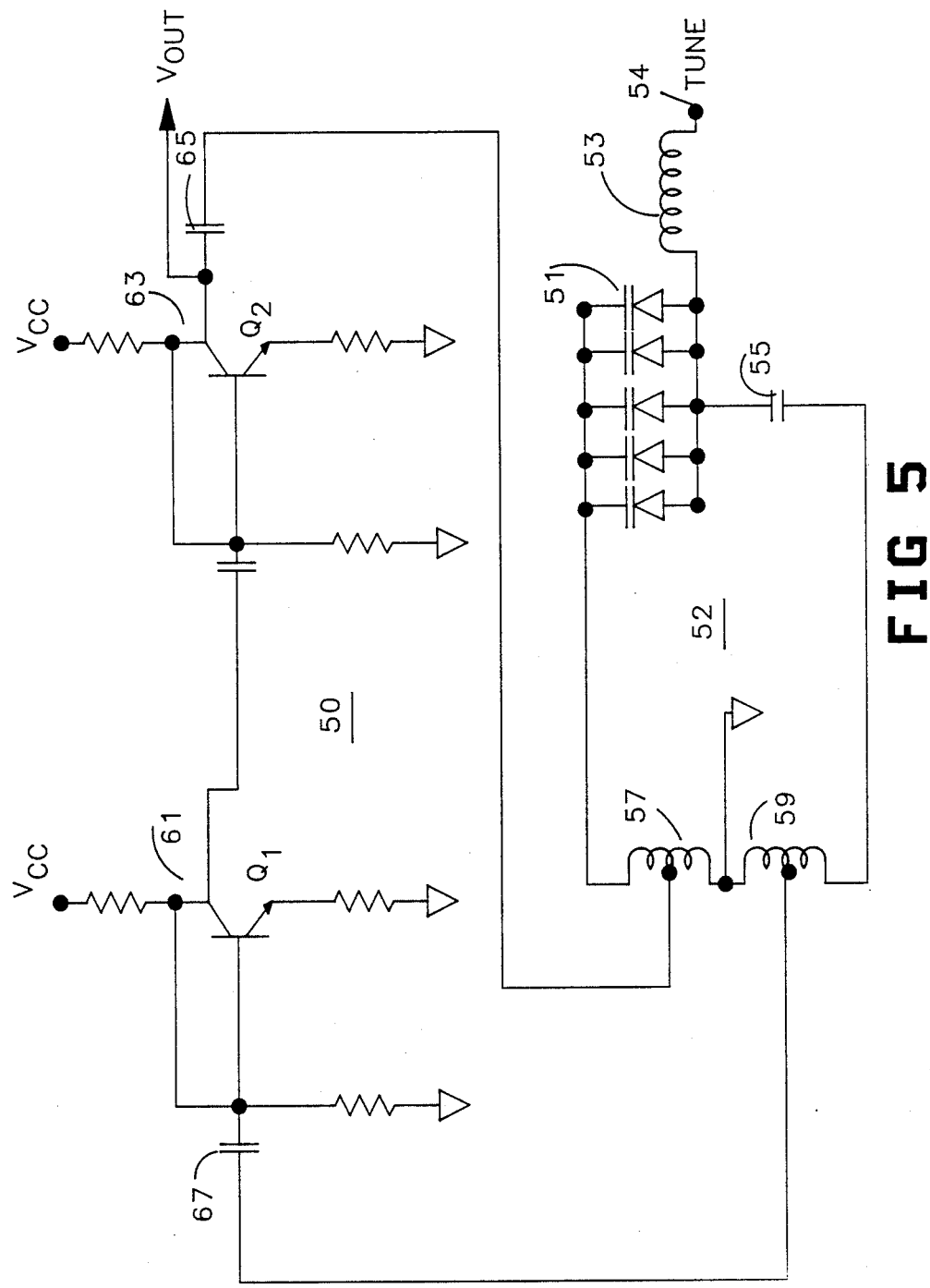
FIG. 5 is a schematic diagram of a second according to the principles of the present invention.

Now referring to FIG. 5, a schematic diagram of a second preferred embodiment of a low noise voltage controlled oscillator according to the present invention is shown. The VCO comprises generally an amplifier circuit 50 and a LC resonant circuit 52. Transistors 61 and 63 are connected to form a two-stage current limiting amplifier having high gain and high input and output impedance. The output signal is coupled to the resonant circuit 52 via series coupling capacitor 65 and tapped inductor 57. The turns ratio of the tapped inductor 57 is adjusted to couple a high current and low RF voltage to the resonator circuit 52.

The LC resonant circuit 52 comprises a number of varactor diodes 51 connected in parallel having a common bias voltage applied through RF choke 53 on tune line 54. Fixed capacitor 55 is connected in series with the varactor diodes 51 to reduce the RF voltage applied to the varactor diodes and to adjust the total capacitance of the resonant circuit 52. Tapped inductor windings 57 and 59 form the inductance element for the resonant circuit 52. Tapped inductor 59 provides the proper feedback to the input of the amplifier 50 via coupling capacitor 67.

Figure 6B:
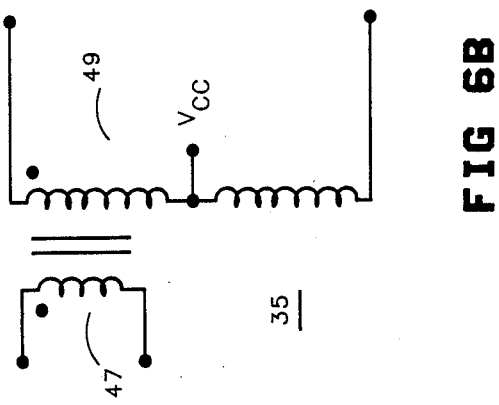
FIG. 6B is a schematic diagram of the equivalent circuit for the semi-rigid coaxial cable utilized in the oscillator of FIG. 6A.
Figure 6A:
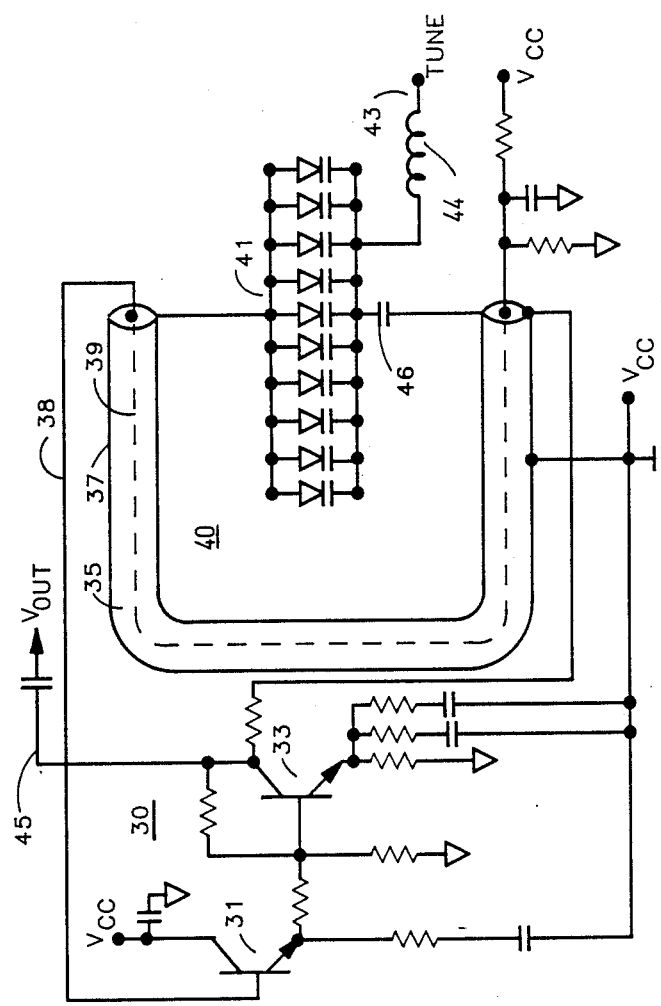
FIG. 6A is a schematic diagram of a third preferred embodiment of a varactor tuned oscillator according to the principles of the present invention.

Referring now to FIGS. 6A and 6B, a schematic diagram of a third preferred embodiment of a low noise voltage controlled oscillator according to the present invention is shown. The VCO comprises generally an amplifier circuit 30 and a LC resonant circuit 40. The amplifier circuit 30 is similar to the amplifier circuit 10 shown in FIG. 4 and comprises a pair of transistors 31, 33 connected as a Darlington pair with the output signal being taken from the collector circuit of transistor 33 on line 45.

The LC resonant circuit 40 is of a transformer configuration that presents a very low impedance, preferably less than 10 ohms, to the collector circuit of transistor 33 thus allowing amplifier 30 to operate with a high bias current while keeping the RF voltage coupled to the LC resonant circuit 40 to a minimum. The inductance element utilized in the LC resonant circuit 40 is comprised of a short length of semi-rigid coaxial cable 35. The equivalent circuit of the semi-rigid coaxial cable 35 is schematically shown in FIG. 6B. The outer conductor 37 is the equivalent of a center tapped primary 49 of a transformer. The inner conductor 39 is the equivalent of a transformer secondary 47. The inner conductor 39 is connected in the input circuit to the base of transistor 31 to provide in-phase feedback to the amplifier 30. The LC resonant circuit 40 comprises a varactor diode circuit 41 having a plurality of varactor diodes 42 connected in parallel to provide a large value of capacitance. Tune line 43 is connected to the cathodes of the parallel varactor diodes to provide a DC bias voltage and tuning signal via choke coil 44. The varactor circuit 41 is connected in series with the outer conductor 37 of coaxial cable 35 to form the LC resonant circuit 40. Since the parallel varactors 42 provide a large total capacitance resulting in a wide frequency band, when the frequency band is wider than desired the total capacitance may be reduced by adding a series capacitor 46 to the LC resonant circuit 40. Including a series capacitor 46 will also reduce the RF voltage on the varactors 42.

The VCO utilizes the Darlington amplifier having a high input impedance and a high gain to provide a carrier signal with a high SNR. A portion of the coaxial cable outer conductor 39 is connected in the collector circuit of transistor 33 to provide coupling between the amplifier 30 and the LC resonant circuit 40. The large impedance mismatch between the amplifier 30 and LC resonant circuit 40 allows the amplifier 30 to operate with a high bias current without coupling a large RF voltage to the LC resonant circuit 40. The low impedance of the LC resonant circuit 40 allows a high RF circulating power in the resonant circuit while keeping the RF voltage swing to a minimum.

In the preferred embodiment shown in FIG. 6A the inductance element 35 is a 1.5 inch length of 0.086 inch diameter semi-rigid coaxial cable. The total inductance is approximately 25 nanoHenries. The LC resonant circuit 40 has a tuning range from 58 MHz to 124 MHz with a tuning voltage varying from 3 volts to 25 volts.

I claim:

1. A voltage controlled oscillator comprising:
   an RF amplifier circuit;
   an LC resonant circuit including a predetermined length of coaxial cable forming an inductive element and a plurality of varactor diodes connected in parallel forming a capacitive element, said length of coaxial cable having dimensions selected to provide a desired range of inductance in a desired frequency range, the values of said inductive element and said capacitive element selected such that said LC resonant circuit has a predetermined range of impedance in said desired frequency range;
   first coupling means coupling an output of said RF amplifier circuit to said LC resonant circuit, the LC resonant circuit impedance presented to said RF amplifier output being less than a predetermined maximum impedance;
   said RF amplifier circuit including current limiting means to limit its output signal current for maintaining a predetermined signal-to-noise ratio and for maintaining a value of RF voltage applied to said LC resonant circuit;
   second coupling means coupling a feedback signal from said LC resonant circuit to an input of said RF amplifier circuit; and
   means for supplying a bias voltage to said plurality of parallel connected varactor diodes for tuning said LC resonant circuit to a predetermined frequency within said desired frequency range.

2. A voltage controlled oscillator as in claim 1 wherein said RF amplifier comprises a pair of transistors connected as a Darlington amplifier.

3. A voltage controlled oscillator as in claim 1 wherein said inductive element comprises the outer conductor of said predetermined length of coaxial cable, said first coupling means comprising a portion of said outer conductor connected in said RF amplifier output circuit coupling said RF amplifier to said LC resonant circuit and said second coupling means comprises the inner conductor of said predetermined length of coaxial cable connected in said RF amplifier input circuit providing a feedback signal from said LC resonant circuit to said RF amplifier.

4. A voltage controlled oscillator as in claim 3 wherein said capacitive element includes a fixed capacitance connected in series with said plurality of parallel connected varactor diodes.

5. A voltage controlled oscillator as in claim 4 wherein said predetermined maximum impedance is less than 15 ohms.

6. A voltage controlled oscillator comprising:
   a current limiting RF amplifier, the output current of said RF amplifier limited to a predetermined value in accordance with a desired signal-to-noise ratio;
   an LC resonant circuit including at least one varactor diode forming a capacitive element and a tapped inductor forming an inductive element, the values of said capacitive element and said inductive element selected to provide a predetermined range of LC resonant circuit impedance in a desired frequency range, said tapped inductor coupling an output of said RF amplifier to said LC resonant circuit, the value of said tapped inductor selected to present an LC resonant circuit impedance to said RF amplifier output of less than fifteen ohms, said tapped inductor adapted to couple an RF signal from said RF amplifier to said LC resonant circuit, said RF signal having a maximum voltage less than a predetermined value;
   an impedance transformation network coupling said LC resonant circuit to an input of said RF amplifier providing a feedback signal from said LC resonant circuit to said RF amplifier; and means for supplying a bias voltage to said varactor diode for tuning said LC resonant circuit to a desired frequency within said desired frequency range.

7. A voltage controlled oscillator as in claim 6 wherein said impedance transformation network is adapted to present a predetermined LC resonant circuit impedance to said input of said RF amplifier in accordance with said desired signal-to-noise ratio.

8. A voltage controlled oscillator comprising:
a current limiting RF amplifier, the output current of said RF amplifier limited to a predetermined value in accordance with a desired signal-to-noise ratio;
an LC resonant circuit including at least one varactor diode forming a capacitive element and a length of coaxial cable forming an inductive element, the values of said capacitive element and the dimensions of said coaxial cable selected to provide a predetermined range of LC resonant circuit impedance in a desired frequency range;
a first impedance transformation network coupling an output of said RF amplifier to said LC resonant circuit, said first impedance transformation network adapted to present an LC resonant circuit impedance to said RF amplifier output of less than fifteen ohms;
a second impedance transformation network coupling said LC resonant network to an input of said RF amplifier providing a feedback signal from said LC resonant circuit to said Rf amplifier; and
means for supplying a bias voltage to said varactor diode for tuning said LC resonant circuit to a desired frequency within said desired frequency range.

9. A voltage controlled oscillator as in claim 8 wherein said inductive element comprises the outer conductor of said length of coaxial cable, said first impedance transformation network comprising a portion of said outer conductor connected in said output coupling said RF amplifier to said LC resonant circuit and said second impedance transformation network comprising the inner conductor of said length of coaxial cable connected in said input providing a feedback signal from said LC resonant circuit to said RF amplifier.

* * * * *